(12) United States Patent
Homann et al.

(10) Patent No.: US 12,267,977 B2
(45) Date of Patent: Apr. 1, 2025

(54) SPACER ELEMENT FOR A PRINTED CIRCUIT BOARD ASSEMBLY

(71) Applicant: BorgWarner Inc., Auburn Hills, MI (US)

(72) Inventors: Kai Homann, Kelkheim (DE); Thomas Glass, Rockenhausen (DE); Andreas Koepper, Buerstadt (DE)

(73) Assignee: BorgWarner Inc., Auburn Hills, MI (US)

( * ) Notice: Subject to any disclaimer, the term of this patent is extended or adjusted under 35 U.S.C. 154(b) by 323 days.

(21) Appl. No.: 17/875,593

(22) Filed: Jul. 28, 2022

(65) Prior Publication Data

US 2023/0397358 A1    Dec. 7, 2023

(30) Foreign Application Priority Data

Jun. 7, 2022  (DE) .................... 10 2022 205 764.3

(51) Int. Cl.
| H05K 7/14 | (2006.01) |
| H05K 1/14 | (2006.01) |
| H05K 3/30 | (2006.01) |

(52) U.S. Cl.
CPC ............. *H05K 7/142* (2013.01); *H05K 1/14* (2013.01); *H05K 3/301* (2013.01); *H05K 2201/2036* (2013.01)

(58) Field of Classification Search
CPC .......... H05K 7/142; H05K 1/14; H05K 3/301; H05K 2201/2036; H05K 2201/042; H05K 3/325; H05K 2201/10409; H05K 1/144; H05K 3/368
See application file for complete search history.

(56) References Cited

U.S. PATENT DOCUMENTS

| 5,345,366 | A | 9/1994 | Cheng et al. |
| 5,355,282 | A | 10/1994 | Yokemura et al. |
| 6,623,279 | B2 | 9/2003 | Derian et al. |
| 7,109,583 | B2 * | 9/2006 | Johnson ............ H01L 23/49811 |
| | | | 257/E21.511 |
| 11,191,179 | B2 * | 11/2021 | Klanke ................ H05K 9/0039 |
| 2002/0016092 | A1 * | 2/2002 | Dibene, II ............. H05K 3/368 |
| | | | 439/74 |
| 2020/0243991 | A1 | 7/2020 | Weidenspointner et al. |

FOREIGN PATENT DOCUMENTS

DE    102014208101 A1    10/2015

OTHER PUBLICATIONS

German Search Report issued on Feb. 8, 2023, in German Application No. 10 2022 205 764.3.

* cited by examiner

*Primary Examiner* — Anthony M Haughton
*Assistant Examiner* — Hung Q Dang
(74) *Attorney, Agent, or Firm* — Eric L. Doyle; Stephan A. Pendorf; Patent Central LLC

(57) ABSTRACT

A multi-functional spacer element for spacing at least one printed circuit board from an opposite spacing surface. The spacer element can not only accomplish the spacing of one or more printed circuit boards, but can also support a fastening function to a carrier element and an electrical ground connection. A passageway extends through the main body. The spacer element includes a press-in element. The spacer element 1 includes an electrically conductive material for electrically conducting from at least a first contact surface to the press-in element.

15 Claims, 6 Drawing Sheets

B - B

B - B

SPACER ELEMENT FOR A PRINTED CIRCUIT BOARD ASSEMBLY

TECHNICAL FIELD

The present invention relates to a spacer element for spacing at least one printed circuit board from an opposite, spacing surface. In particular, the invention relates to a printed circuit board assembly for power electronics having such a spacer element.

BACKGROUND

Printed circuit boards (PCBs) are used in many areas of technology, for example in the control systems of electronic devices in mobile or stationary applications. Here, a wide variety of components, such as electrical and/or electronic components, can be arranged on one or both sides of a PCB. In order to provide space for the components, printed circuit boards may be arranged on or fastened to carrier elements, for example on or in a housing, in a spaced manner, to form a printed circuit board assembly. Such printed circuit board assemblies may comprise one or more spaced printed circuit boards. In addition to the spaced arrangement of a printed circuit board with respect to the carrier element and any other printed circuit boards present, the electromagnetic compatibility (EMC) of the printed circuit boards in a printed circuit board assembly is of great importance. The EMC can usually be implemented by a parasitic coupling of the printed circuit board to a discharge element, such as the carrier element, via which, for example, high-frequency currents can be discharged. Here, it is crucial to maintain a good electrically conductive connection and fastening over as long a service life as possible.

It is an object of the present invention to safely provide a printed circuit board assembly having an improved EMC over a longer service life. In addition, it is an object of the present invention to provide a spacer element that provides an improved EMC over a longer service life of a printed circuit board assembly.

SUMMARY OF THE INVENTION

The present invention relates to a spacer element as claimed in claim 1. Furthermore, the invention relates to a printed circuit board assembly comprising such a spacer element, as claimed in claim 15.

The spacer element according to the invention for spacing at least one printed circuit board from an opposite spacing surface comprises a main body and a press-in element. The main body comprises a first contact surface for bearing against the at least one printed circuit board and a second contact surface for bearing against the spacing surface. The main body has a spacing length between the first contact surface and the second contact surface along a main body axis. A passageway extends through the main body along the main body axis from the first contact surface to the second contact surface. The press-in element is arranged laterally to the main body axis on the main body and extends beyond the second contact surface. In addition, the spacer element comprises an electrically conductive material for electrically conducting from at least the first contact surface to the press-in element.

By means of the features according to the invention, a multi-functional spacer element can be provided. The multi-functional spacer element can not only accomplish the spacing of one or more printed circuit boards, but can also support a fastening function to a carrier element and an electrical ground connection. Over the spacing length of the main body, the at least one printed circuit board can be spaced from the opposite spacing surface. The electrically conductive material can provide electrical contacting with the at least one printed circuit board and the carrier element. The passageway provides a way of guiding through a fastening means, such as a screw connection. By arranging the press-in element laterally to the main body axis, in particular radially outside the passageway, space can be kept free to guide a fastening element through the passageway and beyond the second contact surface. In combination with a fastening means, reliable torque control and thus an exact contact force can be set. This can ensure a longer service life of a printed circuit board assembly. The spacing surface can be, for example, a surface of a second printed circuit board or a surface of the carrier element. The press-in element provides a way for establishing gas-tight contacting by cold welding. In particular, the press-in element may be arranged radially outside the passageway. The press-in element may be arranged laterally of the main body, i.e. radially inwardly and/or radially outwardly adjacently to the second contact surface. Alternatively, the press-in element may be arranged on the second contact surface, i.e. without projecting radially outwardly or radially inwardly. Combinations are also possible. In embodiments in which the press-in element is arranged laterally with respect to the main body, in particular laterally radially outwardly on the main body, the fastening and ground connection can be further distanced from one another and the risk of collapse of corresponding recesses in a carrier element can be avoided or at least reduced. The printed circuit board can support one or more electronic and/or electrical components. The printed circuit board may also be referred to by the term PCB.

In embodiments combinable with any of the preceding embodiments, the press-in element may extend parallel to the main body axis beyond the second contact surface. In alternative embodiments, the press-in element may extend beyond the second contact surface at an angle to the main body axis.

In embodiments combinable with any of the preceding embodiments, the press-in element may have a quadrangular cross-section. In particular, the press-in element may have a rectangular cross-section. In embodiments, the press-in element may have a cross-sectional shape with at least one corner or a polygonal cross-sectional shape. Other cross-sectional geometries common to those skilled in the art for cold welding, such as a geometry having a recess and/or having a knurl, are possible. The one or more corners of the cross-sectional shape do not necessarily have to be exact corners, but can also have small radii or chamfers that are formed in such a way that a cold-welding process remains possible with a press-in indentation that has, for example, a round cross-sectional shape. Thus, the press-in element can enable a cold weld connection in a recess, for example press-in indentation of the carrier element, in order to produce a gas-tight connection for the electrical contact to the ground connection.

In embodiments combinable with any of the preceding embodiments, the main body and the press-in element may be integrally formed together.

In embodiments combinable with any of the preceding embodiments, the spacer element may comprise copper. In particular, the spacer element may be made of copper, especially a copper alloy. In embodiments, other electrically conductive materials such as aluminum or aluminum alloys may also be comprised in the spacer element, or the spacer element may be made from them. In particular, copper provides good electrical conductivity. In addition, copper has a higher standard electrode potential than many other materials, in particular a positive standard electrode potential, which has a lower difference from the standard electrode potential of materials such as gold or silver, which are often arranged in contact regions of the printed circuit boards. Standard electrode potential can be understood as the redox potential of a material under standard conditions.

In embodiments combinable with any of the preceding embodiments, the spacer element may be formed by a stamping and bending process. The spacer element, or the geometry thereof, may be substantially sleeve-shaped with the press-in element projecting laterally therefrom. In alternative embodiments, the spacer element may also be produced by other processes, for example additive or material-removing, such as by milling. By producing the spacer element as a stamped and bent part, low-cost production with low time expenditure can be made possible. In addition, stamping and bending allows high volumes to be produced.

In embodiments combinable with any of the preceding embodiments, the spacer element may further comprise at least one stiffening element. The at least one stiffening element may be arranged on an outer surface of the spacer element. The outer surface may extend between the first contact surface and the second contact surface. Depending on the design and production of the spacer element, the outer surface may in particular be an outer lateral surface. In particular, the outer surface may be oriented to face away from the main body axis. Alternatively or additionally, one or more stiffening elements may be arranged on an inner surface of the spacer element. The inner surface may be understood as the surface of the spacer element that delimits the passageway. Alternatively or additionally, the at least one stiffening element may comprise an elevation. The elevation may protrude outwardly from the outer surface. Alternatively or additionally, the at least one stiffening element may comprise an indentation. The indentation may be recessed into the outer surface. Alternatively or additionally, the at least one stiffening element may be embossed into the spacer element. That is to say, the at least one stiffening element may be a radially inwardly or radially outwardly directed bulge and/or depression. For example, the at least one stiffening element may comprise an elevation in the form of an outwardly directed bulge and an indentation in the form of an outwardly directed depression. Alternatively or additionally, the at least one stiffening element may be rib-like. Alternatively or additionally, the at least one stiffening element may extend at least partially in a direction along the main body axis and/or at least partially in a direction transverse, in particular circumferential, to the main body axis on the spacer element. In particular, the at least one stiffening element may extend at least partially along the outer surface and/or the inner surface of the spacer element. The at least one stiffening element can improve the stability of the spacer element. Moreover, when an overmold element is used, the overmold element can be better adhered or fixed to the spacer element.

In embodiments combinable with any of the preceding embodiments, the first contact surface may be arranged parallel to and opposite the second contact surface along the main body axis. In alternative embodiments, particularly with only one printed circuit board, the first contact surface may also be formed inclined to the second contact surface.

In embodiments combinable with any of the preceding embodiments, the first contact surface and/or the second contact surface may comprise at least one contact material having a higher standard electrode potential than the main body and/or the press-in element. This can provide a lower electrochemical voltage difference with the support surface of the printed circuit board or the spacing surface, which often comprises materials with a high standard electrode potential in their contact regions, such as gold or silver, which are often arranged on printed circuit boards. A lower electrochemical voltage difference can in turn prevent or at least reduce or slow down corrosion, which in turn can reliably maintain good electrical conductivity over a long service life. Additionally, the at least one contact material may be applied by a coating. Alternatively or additionally, the at least one contact material may be applied in the form of one or more contact pads on the first contact surface and/or the second contact surface. Alternatively or additionally, the at least one contact material may comprise tin, palladium, rhodium, silver, gold and/or nickel. In embodiments, in particular several different coatings, material layers and/or contact pads are possible to reduce electrochemical voltage differences between adjacent pairs of materials. In particular, different coatings such as a nickel barrier layer with a silver top layer may be used to maintain the voltage series. In particular, the contact material may be tin, palladium, rhodium, silver, gold and/or nickel or corresponding alloys. When silver or gold is used as the contact material, it may in particular be provided with a nickel sub-layer. Having a nickel sub-layer can be understood as comprising a nickel barrier layer. This can prevent or at least reduce corrosion through pores in the coating.

In embodiments that can be combined with any of the preceding embodiments, the first contact surface and/or the second contact surface can be annular. Annular may in particular also include the form of an annular portion with, for example, an interruption, i.e. not a closed ring. Alternatively, a closed ring shape may be used and understood by annular. Annular further includes circular as well as oval or other round or rounded shapes. Alternatively, other geometries are also conceivable.

In embodiments combinable with any of the preceding embodiments, a press-in pin may be formed on the first contact surface and/or on the second contact surface. The press-in pin may protrude from the relevant contact surface. By means of one or more press-in pins, a simplified orientation of the spacer element can be achieved, especially during assembly.

In embodiments combinable with any of the preceding embodiments, the press-in element may extend beyond the second contact surface. Here, the press-in element may form a first axial end of the spacer element. Additionally, the spacer element may comprise a pressing surface. The pressing surface may be formed opposite the first axial end on the press-in element. Alternatively, the pressing surface may also be arranged on the main body. By means of the pressing surface, a simplified pressing of the spacer element or the press-in element into the carrier element can be achieved. In particular, by providing a surface separate from the first contact surface, the risk of damage to the first contact surface during press-in can be prevented or at least reduced. In embodiments, the pressing surface may be spaced from the first contact surface in the lateral direction. Alternatively or additionally, the pressing surface may be spaced from the first contact surface in the axial direction.

The present invention further relates to a printed circuit board assembly for power electronics. The printed circuit board assembly comprises a carrier element, at least one printed circuit board, at least one fastening means, and at least one spacer element according to any of the preceding embodiments. The carrier element includes at least one fastening indentation and at least one press-in indentation. The at least one printed circuit board comprises at least one fastening recess. The at least one spacer element is arranged between the printed circuit board and the carrier element. Via the at least one fastening means, the at least one printed circuit board is fastened to the carrier element. By means of the spacer element between the printed circuit board and the carrier element, the printed circuit board can be arranged spaced apart from the carrier element. Via the fastening means and the spacer element, a spaced fastening can be implemented. An electrical ground connection can be provided via the spacer element. Thus, high-frequency currents can be dissipated and an EMC grounding of the at least one printed circuit board can be achieved.

In embodiments of the printed circuit board assembly, the fastening means may be retained in the fastening indentation.

In embodiments of the printed circuit board assembly that are combinable with any of the preceding embodiments, the press-in element may be pressed into the press-in indentation. This may provide electrical contacting, particularly gas-tight electrical contacting, between the spacer element and the carrier element.

In embodiments of the printed circuit board assembly that are combinable with any of the preceding embodiments, the fastening means may be a screw. The fastening indentation may be a threaded bore into which the screw is screwed. The at least one printed circuit board may be braced in the direction of the carrier element via a screw head of the screw. Here, a counterforce for spacing can be applied by the spacer element. In other words, the at least one printed circuit board can be clamped between the spacer element, in particular the first contact surface thereof, and the screw head.

In embodiments of the printed circuit board assembly that are combinable with any of the preceding embodiments, the press-in element and the press-in indentation may be formed such that cold welding occurs when the press-in element is pressed in. By cold welding, a gas-tight electrical contact between the spacer element and the carrier element can be achieved in a simple way.

In embodiments of the printed circuit board assembly that are combinable with any of the preceding embodiments, the fastening indentation and the press-in indentation may be formed in the carrier element spaced apart from one another.

In embodiments of the printed circuit board assembly that are combinable with any of the preceding embodiments, the carrier element may be a housing of the printed circuit board assembly. Alternatively, the printed circuit board assembly may further comprise a housing in which the carrier element, the at least one printed circuit board, the at least one spacer element, and the at least one fastening means are arranged.

In embodiments of the printed circuit board assembly that are combinable with any of the preceding embodiments, the carrier element may comprise aluminum or an aluminum alloy. In particular, the carrier element may comprise aluminum or an aluminum alloy. In embodiments, the housing may comprise aluminum or an aluminum alloy. In particular, the housing may comprise aluminum or an aluminum alloy.

In embodiments of the printed circuit board assembly that are combinable with any of the preceding embodiments, the carrier element may comprise a support surface. The support surface may be oriented parallel to the at least one printed circuit board. Additionally, the support surface may be oriented in the same direction as the first contact surface. Alternatively or additionally, the support surface may comprise an electrically insulating layer such as an oxide material. In particular, the support surface may be coated with an oxide layer. The oxide material or the oxide layer can provide an electrical insulation. This may be particularly advantageous, when the printed circuit board assembly comprises a first printed circuit board and a second printed circuit board, when the second printed circuit board rests on the support surface, to provide a better cooling effect for the second printed circuit board.

In embodiments of the printed circuit board assembly that are combinable with any of the preceding embodiments, the at least one printed circuit board may include an upper board surface and a lower board surface. The at least one fastening recess may extend from the upper board surface through the printed circuit board to the lower board surface. Additionally, the at least one printed circuit board may comprise a first printed circuit board. The first contact surface may bear, with contact, against the lower board surface of the first printed circuit board. This may provide electrical contact between the first printed circuit board and the spacer element for grounding the printed circuit board in the carrier element.

In embodiments of the printed circuit board assembly that are combinable with the preceding embodiment, the lower board surface of the first printed circuit board may comprise a first contact surface portion. Additionally, the first contact surface portion may be arranged around the at least one fastening recess and contacting the first contact surface. Alternatively or additionally, the first contact surface portion may be annular. In particular, the first contact surface portion may be formed as an annular portion with, for example, an interruption. In embodiments, geometries other than annular formations of the first contact surface portion are also possible. In particular, the first contact surface portion may be formed to match the first contact surface, such that the first contact surface is arranged within the first contact surface portion. In other words, the first contact surface and/or the first contact surface portion may be formed such that the first contact surface is in contact only with the first contact surface portion and no other region of the lower board surface of the first printed circuit board.

In embodiments of the printed circuit board assembly that are combinable with the preceding embodiment, the first contact surface portion and the first contact surface may be configured in such a way that they form a first pair of materials having a maximum electrochemical voltage difference of from 0.0 V to 1.0 V, particularly from 0.1 V to 0.75 V and preferably from 0.2 V to 0.5 V with respect to their standard electrode potentials. In embodiments, the first pair of materials may have an electrochemical voltage difference of less than 1.0 V, in particular less than 0.75 V, preferably less than 0.5 V and particularly preferably less than 0.25 V. A lower electrochemical voltage difference of the first pair of materials can prevent or at least reduce or slow down corrosion, which in turn can reliably maintain good electrical conductivity over a long service life.

In embodiments of the printed circuit board assembly that are combinable with any of the preceding two embodiments, the first contact surface portion may comprise at least one coating. The coating may comprise or be made of tin, palladium, rhodium, silver, gold, and/or nickel. Alternatively or additionally, the first contact surface portion may comprise at least one contact pad. The contact pad may comprise or be made of tin, palladium, rhodium, silver, gold, and/or nickel. In particular, the coating and/or the contact pad may comprise or be made of alloys comprising such materials. In particular, multiple different coatings or layers of materials are possible to reduce electrochemical voltage differences between adjacent pairs of materials. In particular, when silver or gold are used as contact materials, they may be provided with a nickel sub-layer. Having a nickel sub-layer can be understood as comprising a nickel barrier layer. This can prevent or at least reduce corrosion through pores in the coating.

In embodiments of the printed circuit board assembly that are combinable with any of the preceding embodiments, the fastening means may be a screw. The fastening indentation may be a threaded bore into which the screw is screwed. The at least one printed circuit board may be braced in the direction of the carrier element via a screw head of the screw. Furthermore, the at least one printed circuit board may have an upper board surface and a lower board surface. The at least one fastening recess may extend from the upper board surface through the printed circuit board to the lower board surface. Additionally, the at least one printed circuit board may comprise a first printed circuit board. The first contact surface may bear, with contact, against the lower board surface of the first printed circuit board. The screw head may bear against the upper board surface of the first printed circuit board and brace it in the direction of the carrier element.

In embodiments of the printed circuit board assembly that are combinable with any of the preceding embodiments and in which the carrier element comprises a support surface, the second contact surface may bear, with contact, against the support surface of the carrier element. Alternatively formulated, the support surface may correspond to the spacing surface. In particular, the second contact surface may bear, with contact, against the support surface of the carrier element such that the passageway is aligned with the fastening indentation.

In embodiments of the printed circuit board assembly that are combinable with any of the preceding embodiments and in which the at least one printed circuit board comprises a first printed circuit board, the at least one printed circuit board may further comprise a second printed circuit board. The first contact surface may bear, with contact, against the bottom board surface of the first printed circuit board. The second printed circuit board may be arranged parallel to the first printed circuit board. The second contact surface may bear, with contact, against the upper board surface of the second printed circuit board. Alternatively formulated, the upper board surface of the second printed circuit board may correspond to the spacing surface. Since the first contact surface is in contact with the lower board surface of the first printed circuit board and the second contact surface is in contact with the upper board surface of the second printed circuit board, the two printed circuit boards can be arranged spaced apart from one another over the spacing length. At the same time, the electrical ground connection between the carrier element and the printed circuit boards can be established via the spacer element.

In embodiments of the printed circuit board assembly that are combinable with the preceding embodiment, the second printed circuit board may be arranged between the carrier element and the second contact surface. This allows the second printed circuit board to be fixed between the carrier element and the spacer element by the fastening means.

In embodiments of the printed circuit board assembly that can be combined with the preceding embodiment and in which the carrier element comprises a support surface, the second printed circuit board can rest with its lower board surface on the support surface of the carrier element. This embodiment may be particularly advantageous when the support surface and/or the lower board surface of the second printed circuit board comprises an oxide material and/or an oxide layer. This allows the second printed circuit board to be arranged on the housing in an electrically insulated manner. As a result of the second printed circuit board resting on the support surface, a better heat dissipation or cooling effect for the second printed circuit board can be achieved.

In embodiments of the printed circuit board assembly that are combinable with any of the preceding three embodiments, the upper board surface of the second printed circuit board may comprise a second contact surface portion. The second contact surface portion may be arranged around the at least one fastening recess and contacting the second contact surface. Alternatively or additionally, the second contact surface portion may be annular. In particular, the second contact surface portion may be formed as an annular portion with, for example, an interruption. In embodiments, geometries other than annular formations of the second contact surface portion are also possible. In particular, the second contact surface portion may be formed to match the second contact surface such that the second contact surface is arranged within the second contact surface portion. In other words, the second contact surface and/or the second contact surface portion may be formed such that the second contact surface is in contact only with the second contact surface portion and no other region of the upper board surface of the second printed circuit board.

In embodiments of the printed circuit board assembly that are combinable with the preceding embodiment, the second contact surface portion and the second contact surface may be configured to form a second pair of materials having a maximum electrochemical voltage difference of from 0.0 V to 1.0 V, particularly from 0.1 V to 0.75 V and preferably from 0.2 V to 0.5 V with respect to their standard electrode potentials. In embodiments, the second pair of materials may have an electrochemical voltage difference of less than 1.0 V, in particular less than 0.75 V, preferably less than 0.5 V and particularly preferably less than 0.25 V. Due to a lower electrochemical voltage difference of the second pair of materials, corrosion can be avoided or at least reduced or slowed down, which in turn allows good electrical conductivity to be reliably maintained over a long service life.

In embodiments of the printed circuit board assembly that are combinable with any of the preceding two embodiments, the second contact surface portion may comprise at least one coating. The coating may comprise or be made of tin, palladium, rhodium, silver, gold, and/or nickel. Alternatively or additionally, the second contact surface portion may comprise at least one contact pad. The contact pad may comprise or be made of tin, palladium, rhodium, silver, gold, and/or nickel. In particular, the coating and/or contact pad may comprise or be made of alloys comprising such materials. In particular, multiple different coatings or layers of materials are possible to reduce electrochemical voltage differences between adjacent pairs of materials. In particular, when silver or gold are used as contact materials, they may be provided with a nickel sub-layer. Having a nickel sub-layer can be understood as comprising a nickel barrier layer. This can prevent or at least reduce corrosion through pores in the coating.

In embodiments of the printed circuit board assembly that are combinable with any of the preceding embodiments and in which the at least one printed circuit board comprises a first printed circuit board and a second printed circuit board, the second printed circuit board may include at least one press-in recess spaced from the at least one fastening recess.

The press-in recess may be aligned with the at least one press-in indentation of the carrier element.

In embodiments of the printed circuit board assembly that are combinable with the preceding embodiment, the at least one press-in recess may extend from the upper board surface through the second printed circuit board to the lower board surface. The press-in element may extend through the press-in recess and be pressed into the press-in indentation of the carrier element.

In embodiments of the printed circuit board assembly that are combinable with any of the preceding embodiments, the printed circuit board assembly may comprise at least two spacer elements and at least two fastening means. The carrier element may include at least two fastening indentations and two press-in indentations. The at least one printed circuit board may include at least two fastening recesses each. In addition, the at least one printed circuit board may be fastened to the carrier element via the at least two fastening means, each of which extends through a fastening recess, through a passageway, and into its own fastening indentation.

In embodiments of the printed circuit board assembly that are combinable with the preceding embodiment, the printed circuit board assembly may further comprise a plate-shaped overmold element. The overmold element may be fastened to the main bodies of the at least two spacer elements. Furthermore, the overmold element may extend parallel to the at least one printed circuit board. Such embodiments are particularly advantageous in combination with one or more stiffening elements on at least one of the spacer elements, since the stiffening element can provide better retention of the overmold element. By means of the overmold element, a simplified retention and orientation of the at least one printed circuit board and the spacer elements can be made possible, in particular during assembly. In addition, the overmolded element can enable a holder for another printed circuit board, in particular an intermediate printed circuit board. Furthermore, the overmold element can improve a stiffness and vibration resistance of the printed circuit board assembly.

In embodiments of the printed circuit board assembly that are combinable with the preceding embodiment, the overmold element may comprise a plastics material. In particular, the overmold element may be produced from a plastics material. For example, the plastics material may comprise polybutylene terephthalate (PBT) or other suitable plastics familiar to those skilled in the art for such purposes. In addition, the plastics material may be applied by plastic overmolding.

In embodiments of the printed circuit board assembly that are combinable with any of the preceding two embodiments, the printed circuit board assembly may further comprise an intermediate printed circuit board. The intermediate printed circuit board may be arranged on an upper surface of the overmold element. In particular, the intermediate printed circuit board may be fastened to the upper surface of the overmold element. Additionally, the intermediate printed circuit board may be arranged parallel to the at least one printed circuit board. Alternatively or additionally, in embodiments in which the at least one printed circuit board comprises a first printed circuit board and a second printed circuit board, the intermediate printed circuit board may be arranged between the first printed circuit board and the second printed circuit board. In embodiments, the printed circuit board assembly may also comprise a plurality of intermediate printed circuit boards arranged on the one or more overmold elements.

The present invention further relates to power electronics. The power electronics comprises a printed circuit board assembly according to any of the preceding embodiments.

BRIEF DESCRIPTION OF THE FIGURES

FIG. 1b shows a plan view of the spacer element from FIG. 1a;

FIG. 3b shows the printed circuit board assembly from FIG. 4a in a fastened state and with the press-in element pressed in.

DETAILED DESCRIPTION

Figure 1A:
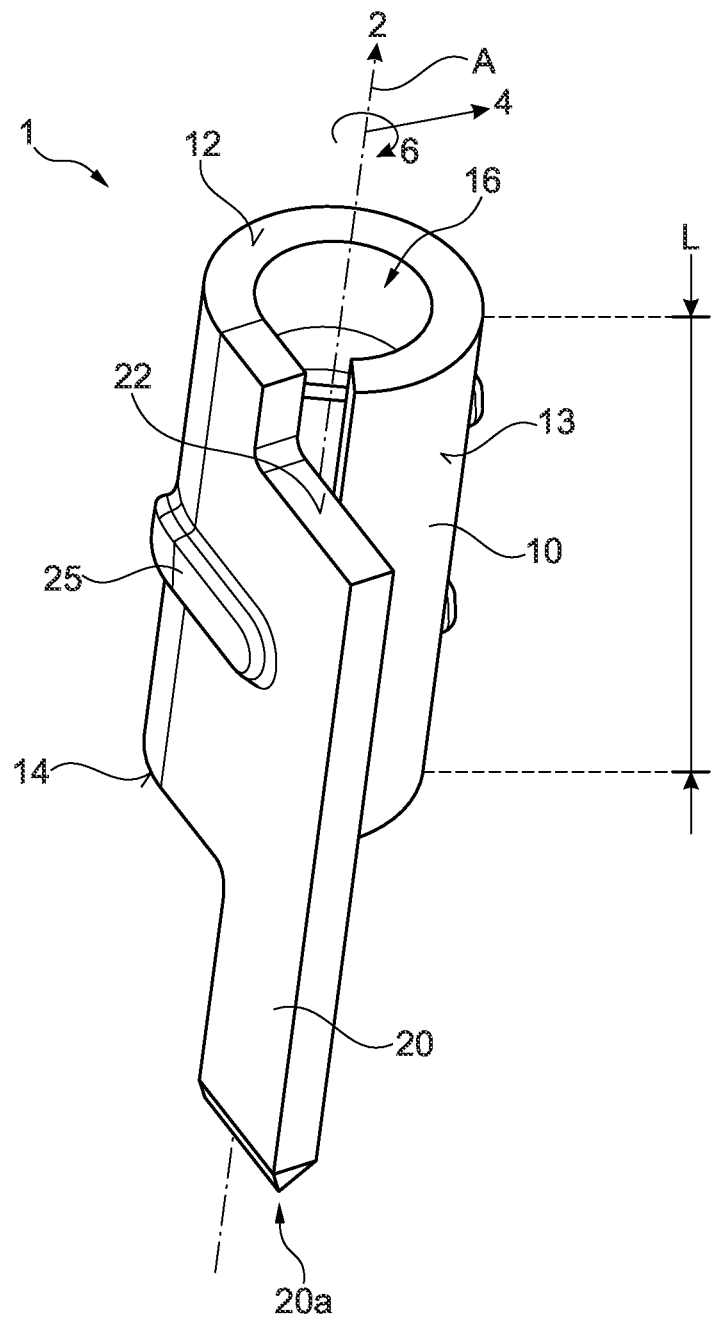
FIG. 1a shows a perspective view of an exemplary spacer element.

In the context of this application, the terms axial and axial direction 2 refer to a main body axis A of the main body 10 or of the spacer element 1. With reference to the figures (see, for example, FIGS. 1a and 1b), the axial direction 2 of the main body 10 or of the spacer element 1 is represented by the reference sign 2. A radial direction 4 here refers to the axis A or axial direction 2 of the main body 10 or the spacer element 1. Likewise, a circumference or circumferential direction 6 here refers to the axis A or axial direction 2 of the main body 10 or the spacer element 1. A tangent, tangential direction, or the term tangential in the context of this application refers to the circumferential direction 6.

Figure 1B:
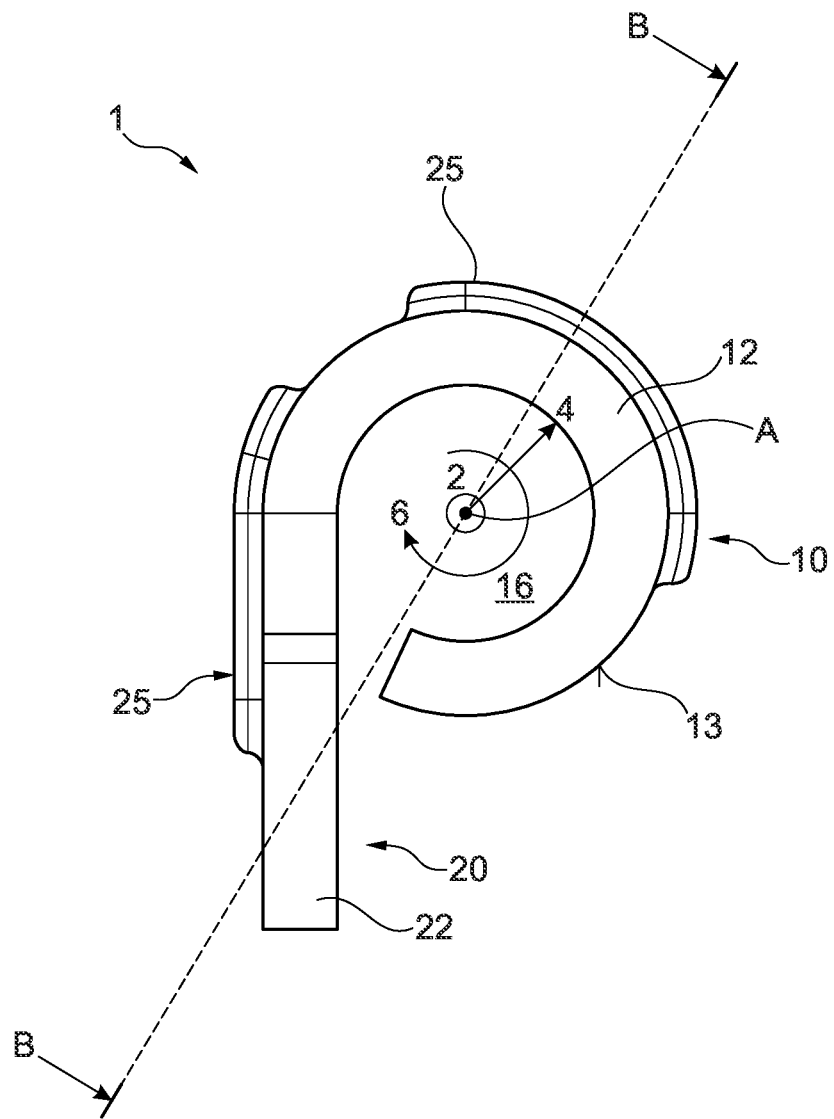

FIGS. 1a and 1b show an exemplary spacer element 1 suitable for spacing at least one printed circuit board 30 from an opposite spacing surface. Depending on the embodiment, the spacing surface may be, for example, a surface, in particular an upper board surface 31, of a second printed circuit board 30c, or a surface, in particular a support surface 46, of a carrier element 40, 40a. Referring to FIG. 1a, the spacer element 1 comprises a main body 10 and a press-in element 20. The main body 10 comprises a first contact surface 12 for abutment against the at least one printed circuit board 30 and a second contact surface 14 for abutment against the spacing surface. Between the first contact surface 12 and the second contact surface 14, the main body 10 has a spacing length L along a main body axis A. The main body 10 extends from the first contact surface 12 to the second contact surface 14. In turn, a passageway 16 extends through the main body 10 from the first contact surface 12 to the second contact surface 14 along the main body axis A. Further, the main body 10 comprises an inner surface and an outer surface 13. The outer surface 13 extends radially outwardly on the main body 10 between the first contact surface 12 and the second contact surface 14. In particular, the outer surface 13 may also be referred to as an outer lateral surface 13. In particular, the outer surface 13 may be oriented such that it faces away from the main body axis A. The inner surface 13 may be understood as the surface of the spacer element 1 that delimits the passageway 16 in the radial direction 4. Alternatively expressed, the passageway 16 is delimited or formed by the inner surface 13 of the main body 10. Alternatively, the inner surface may also be referred to as the inner lateral surface.

The press-in element 20 is arranged laterally to the main body axis A on the main body 10 and extends, in particular in the axial direction 2, beyond the second contact surface 14. Alternatively expressed, the press-in element 20 extends from a first position between the first contact surface 12 and the second contact surface 14 to a second position laterally along the main body 10, wherein the second position projects in the axial direction 2 (from the first contact surface 12 to the second contact surface 14) beyond the second contact surface 14. Here, the press-in element 20 may form a first axial end 20a of the spacer element 1 at the second position. The press-in element 20 of the exemplary spacer element 1 from FIG. 1a is arranged laterally, in particular tangentially, on the main body 10. Here, the press-in element 20 is arranged radially outside the passageway 16. In particular, the press-in element 20 is arranged radially spaced apart from the passageway 16. Opposite the first axial end 20a, a pressing surface 22 may be formed on the press-in element 20, as shown in FIG. 1a and FIG. 1b. By means of the pressing surface 22, a simplified pressing of the spacer element 1 or of the press-in element 20 into the carrier element 40 can be achieved. In particular, by providing a surface (by the pressing surface 22) separate from the first contact surface 12, the risk of damage to the first contact surface 12 during the pressing-in process can be prevented or at least reduced. As shown in FIG. 1a and FIG. 1b, the pressing surface 22 may be spaced from the first contact surface 12 in the lateral direction and/or in the axial direction 2. In the example shown, the pressing surface 22 is formed by a step in the spacer element 1 in the axial direction 2 relative to the second contact surface 14. That is to say, the exemplary pressing surface 22 is axially recessed and laterally offset from the first contact surface 12. The pressing surface 22 could also be formed, for example, by a recess or a shoulder in the press-in element 20 and/or in the main body 10. In alternative embodiments, no separate pressing surface 22 may be provided. Alternatively, the pressing surface 22 may also be arranged on the main body 10 and/or at the same axial height as the first contact surface 12. In further embodiments, the pressing surface 22 may be coated to prevent or at least reduce damage from a press-in tool.

In alternative embodiments, the press-in element 20 could be arranged on the main body 10 in a radial direction 4 or in a direction between a radial direction 4 and a tangential direction. In principle, the term "lateral" or a "lateral direction" may include a radial direction 2 and/or a circumferential direction 6, and in particular may also be a tangential direction or resultant thereof. In further alternative embodiments, the press-in element 20 could also be arranged on the second contact surface 14 and extend therefrom in the axial direction 2 beyond the second contact surface 14. Extending beyond the second contact surface 14 in the axial direction 2 is to be understood in the sense of the present disclosure as a direction away from the first contact surface 12 and the second contact surface 14. In particular, it is to be understood as an axial direction 2 opposite the arrow 2 as shown in FIG. 1a. In embodiments in which the press-in element 20 is arranged on the second contact surface 14, the press-in element 20 can project radially outwardly and/or radially inwardly beyond the second contact surface 14. However, it is advantageous here if the press-in element 20 does not protrude radially inwardly or protrudes radially inwardly only to a small extent in order to provide sufficient space for a fastening means 50, such as a screw, to pass through the passageway 16.

As can be seen particularly with reference to FIG. 1a, the press-in element 20 may extend parallel to the main body axis A beyond the second contact surface 14. Alternatively expressed, the press-in element 20 is arranged on the main body 10 parallel to the main body axis A. In alternative embodiments, the press-in element 20 may extend inclined to the main body axis A beyond the second contact surface 14. The press-in element 20 has a quadrangular, in particular rectangular, cross-section. Thus, the press-in element 20 can enable a cold weld connection in a recess, for example press-in indentation 44 of the carrier element 40, to establish a gas-tight connection for the electrical contact to the ground connection. In embodiments, the press-in element 20 may have a cross-sectional shape with at least one corner or a polygonal cross-sectional shape. Other cross-sectional geometries common to those skilled in the art for cold welding, such as a geometry having a recess and/or having a knurl, are possible. The one or more corners of the cross-sectional shape do not necessarily have to be exact corners, but can also have small radii or chamfers that are formed in such a way that a cold welding process remains possible with a press-in indentation that has, for example, a round cross-sectional shape. Alternatively, the press-in element 20 can also be round, in particular circular or oval, and the carrier element 40 can have a cross-sectional geometry correspondingly suitable for cold welding, such as a quadrangular geometry or a round geometry with knurl (for example, inwardly protruding elements).

In addition, the spacer element 1 comprises an electrically conductive material for electrical conduction from at least the first contact surface 12 to the press-in element 20. By means of the electrically conductive material, electrical contact can be provided with the at least one printed circuit board 30 and the carrier element 40. Alternatively formulated, the electrically conductive material can provide an electrical connection between the contact surfaces 12, 14 with each other on the one hand, and between the contact surfaces 12, 14 and the press-in element 20 through the spacer element 1 on the other hand.

In advantageous embodiments, the spacer element 1 may be made of copper. Alternatively, the spacer element 1 may also comprise only copper to provide the electrical conductivity described. In particular, the spacer element 1 may be made of a copper alloy. Alternatively, other electrically conductive materials such as aluminum or aluminum alloys may be included in the spacer element 1, or the spacer element 1 may be made of them. In particular, copper provides good electrical conductivity. In addition, copper has a higher standard electrode potential than many other materials, in particular a positive standard electron potential. Compared to, for example, aluminum, copper has a lower electrochemical voltage difference from the standard electrode potential of materials such as, for example, gold or silver, which are often arranged in contact regions of the printed circuit boards 30. Standard electrode potential can be understood as the redox potential of a material under standard conditions.

In advantageous embodiments, the main body 10 and the press-in element 20 may be integrally formed together. For example, the spacer element 1 can be produced in a stamping and bending process, wherein the main body 10 and the press-in element 20 are formed. As can be seen in particular from FIG. 1a, the spacer element 1 or its geometry is substantially sleeve-shaped with the laterally projecting press-in element 20. In addition, the sleeve-shaped main body 10 has a slot extending in the axial direction 2. This slot is fundamentally production-related due to the stamping and bending process, but could also be smaller or larger, in particular in the circumferential direction 6. Also, the slot could be minimal or absent, so that a sleeve-shaped main body 10 closed substantially in the circumferential direction 6 is formed. In alternative embodiments, the spacer element 1 may also be produced by other processes, for example additive or material-removing, such as by milling. By producing the spacer element 1 as a stamped and bent part, a low-cost production process with a low time expenditure can be made possible. In addition, stamping and bending production enables large quantities to be produced at low cost.

The features according to the invention can provide a multi-functional spacer element 1. The multi-functional spacer element 1 can provide not only the spacing of one or more printed circuit boards 30, 30*a*, 30*b*, 30*c*, but can also implement a fastening function on a carrier element 30 and an electrical ground connection. The at least one printed circuit board 30 can be spaced from the opposite spacing surface over the spacing length L of the main body 10. The passageway 16 provides a way of guiding through a fastening means 50, such as a screw connection means or screw. By arranging the press-in element 20 laterally to the main body axis A, in particular radially outside the passageway 16, space can be kept free to pass a fastening means 50 through the passageway 16 and beyond the second contact surface 14. In combination with a fastening means 50, a reliable torque control and thus an exact contact force can be set. This can ensure a longer service life of a printed circuit board assembly 100. The press-in element 20 provides a way of providing gas-tight contacting by cold welding. By spacing the press-in element 20 from the passageway 16 and from the second contact surface 14, the fastening and ground connection can be further spaced apart and the risk of collapse of corresponding recesses in a carrier element 40 can be avoided or at least reduced.

In the exemplary embodiment of FIGS. 1*a* and 1*b*, the spacer element 1 further comprises three stiffening elements 25, which are embossed into the spacer element 1 in the form of bulges. Thereby, each of the stiffening elements 25 forms a protrusion on the outer surface 13 and a corresponding indentation on the inner surface. The stiffening elements 25 extend in a rib-like manner in the circumferential direction 6 over a portion of the outer surface 13. Alternatively, the stiffening elements 25 could extend over larger or smaller regions of the outer surface 13. Furthermore, one or more stiffening elements 25 could extend in an axial direction 2 and/or in a transverse direction, in particular in a direction between the circumferential direction 6 and the axial direction 2 on the spacer element 1. Also, one or more stiffening elements 25 could comprise directional changes such as a wave shape or a zig-zag shape. In particular, the one or more stiffening elements 25 may extend at least partially along the outer surface 13 and/or the inner surface of the spacer element 1. Here, the one or more stiffening elements 25 may also be arranged on only the outer surface 13 or only the inner surface in the form of an elevation and/or an indentation. The stability of the spacer element 1 can be improved by the at least stiffening element 25. Moreover, when an overmold element 60 is used, the overmold element 60 can be better adhered or fixed to the spacer element 1 than if the spacer element 60 had a smooth outer surface 13. The stiffening element 25, or the bulge formed by it, may also be referred to as an overmold bulge, since it may further serve to (additionally) retain an optional plastic overmold or overmold element 60. Even though three stiffening elements 25 are shown in the figures, this is only to be understood as an example. In alternative embodiments, the spacer element 1 could also comprise only one, two, or more than three equally or differently formed stiffening elements 25. The stiffening elements 25 may advantageously improve the stiffness of the spacer element 1 and improve the adhesion of an optional overmold. Nevertheless, in some embodiments (with or without overmold element 60), it may be that no stiffening elements 25 are provided.

The first contact surface 12 is arranged parallel to and along the main body axis A, opposite the second contact surface 14 (see FIG. 1*a*). In alternative embodiments, in particular with only one printed circuit board 30, the first contact surface 12 can also be formed inclined to the second contact surface 14. However, parallel contact surfaces 12, 14 can advantageously lead to improved stability of the system and improved positioning of the spacer element 1 relative to the at least one printed circuit board 30.

The first contact surface 12 and/or the second contact surface 14 may comprise at least one contact material having a higher standard electrode potential than the main body 10 and/or the press-in element 20, thereby enabling a lower electrochemical voltage difference with the support surface of the printed circuit board 30 or the spacing surface, respectively, which in their contact regions often comprise materials with a high standard electrode potential, such as gold or silver, which are frequently arranged on printed circuit boards. A lower electrochemical voltage difference can prevent or at least reduce or slow down corrosion, which in turn can reliably maintain good electrical conductivity over a long service life. Additionally, the at least one contact material may be applied by a coating. Alternatively or additionally, the at least one contact material may be applied in the form of one or more contact pads on the first contact surface 12 and/or the second contact surface 14. Alternatively or additionally, the at least one contact material may comprise tin, palladium, rhodium, silver, gold and/or nickel. In embodiments, in particular a plurality of different coatings, material layers and/or contact pads are possible to reduce electrochemical voltage differences between adjacent pairs of materials. In this regard, the multiple different coatings, material layers, and/or contact pads may be stacked. In particular, different coatings such as a nickel barrier layer with a silver top layer can be used to maintain the voltage series. In particular, the contact material can be tin, palladium, rhodium, silver, gold and/or nickel or corresponding alloys. When silver or gold is used as the contact material, it may in particular be provided with a nickel sub-layer. Having a nickel sub-layer can be understood as comprising a nickel barrier layer. This can prevent or at least reduce corrosion through pores in the coating.

The first contact surface 12 and the second contact surface 14 are substantially annular (see FIG. 1*b*). Annular may in particular also include the form of an annular portion with, for example, an interruption, i.e. not a closed ring. Alternatively, a closed ring shape may also be used and understood by annular. Annular further includes circular as well as oval or other round or rounded shapes. Alternatively to the preferred annular embodiment, other geometries such as polygonal or angular geometries are also conceivable. An annular geometry can lead to simplified manufacturing. In addition, an annular geometry can reduce pressure load peaks compared to an angular geometry.

In embodiments, one or more press-in pins may be formed on the first contact surface 12 and/or on the second contact surface 14 (not shown in the figures). The one or more press-in pins may protrude from the relevant contact surface 12, 14. By means of one or more press-in pins, a simplified orientation of the spacer element 1 can be achieved, especially during assembly. A mating surface to the relevant contact surface 12, 14, such as a support surface on the printed circuit board 30 or on the carrier element 40 may have corresponding indentations for receiving the one or more press-in pins. The one or more press-in pins may, for example, be square or round in shape. Unlike the press-in element, the press-in pins are not used for gas-tight connection and are not cold-welded. In addition, the press-in pins are substantially smaller in size and cover only a portion of the relevant contact surface 12, 14, said portion being smaller in diameter than a radial thickness of the relevant contact surface 12, 14.

Figure 3A:
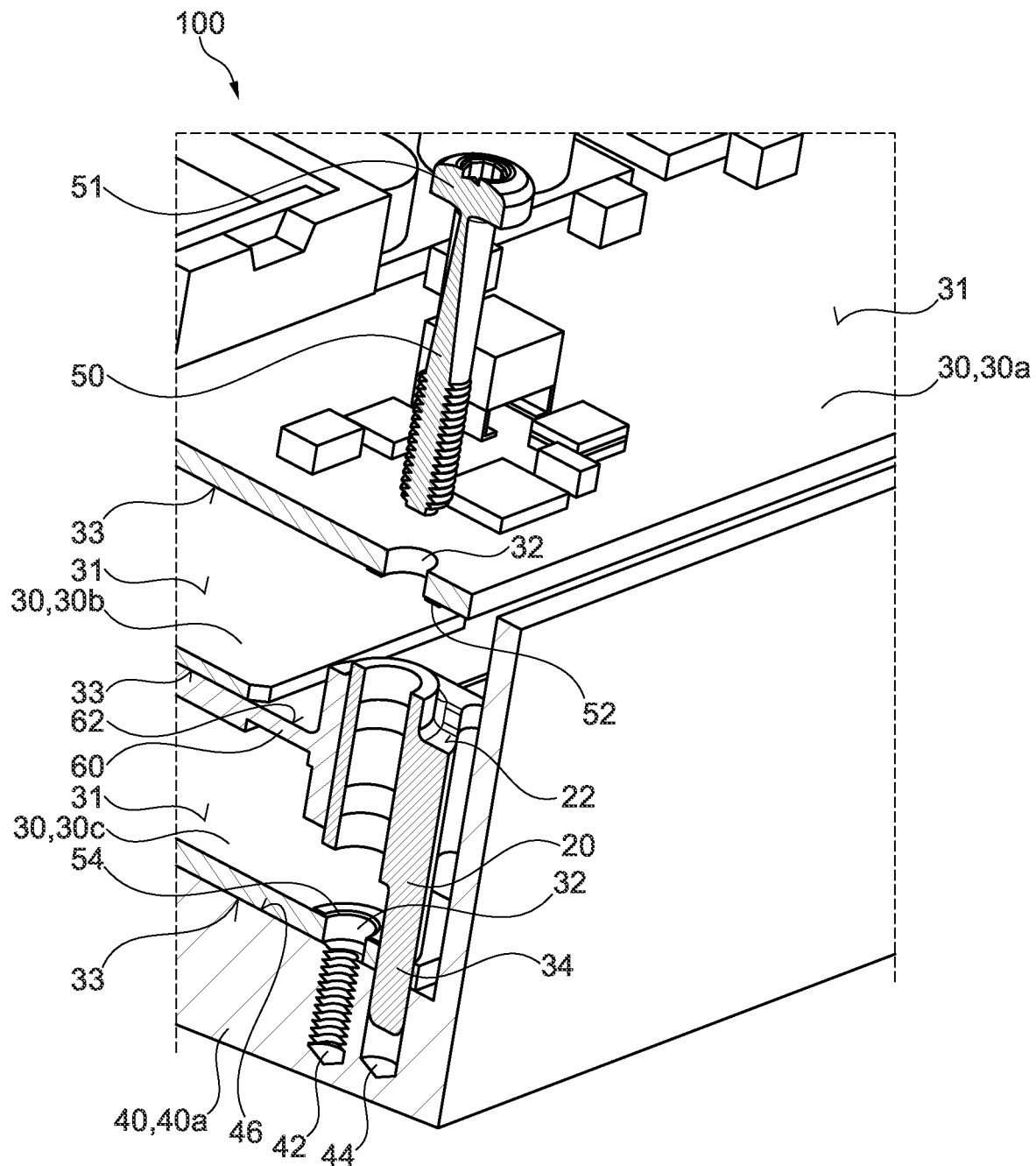
FIG. 3a shows an exemplary printed circuit board assembly with three printed circuit boards in a side sectional view along the section B-B from FIG. 1b in a state before fastening.
Figure 3B:
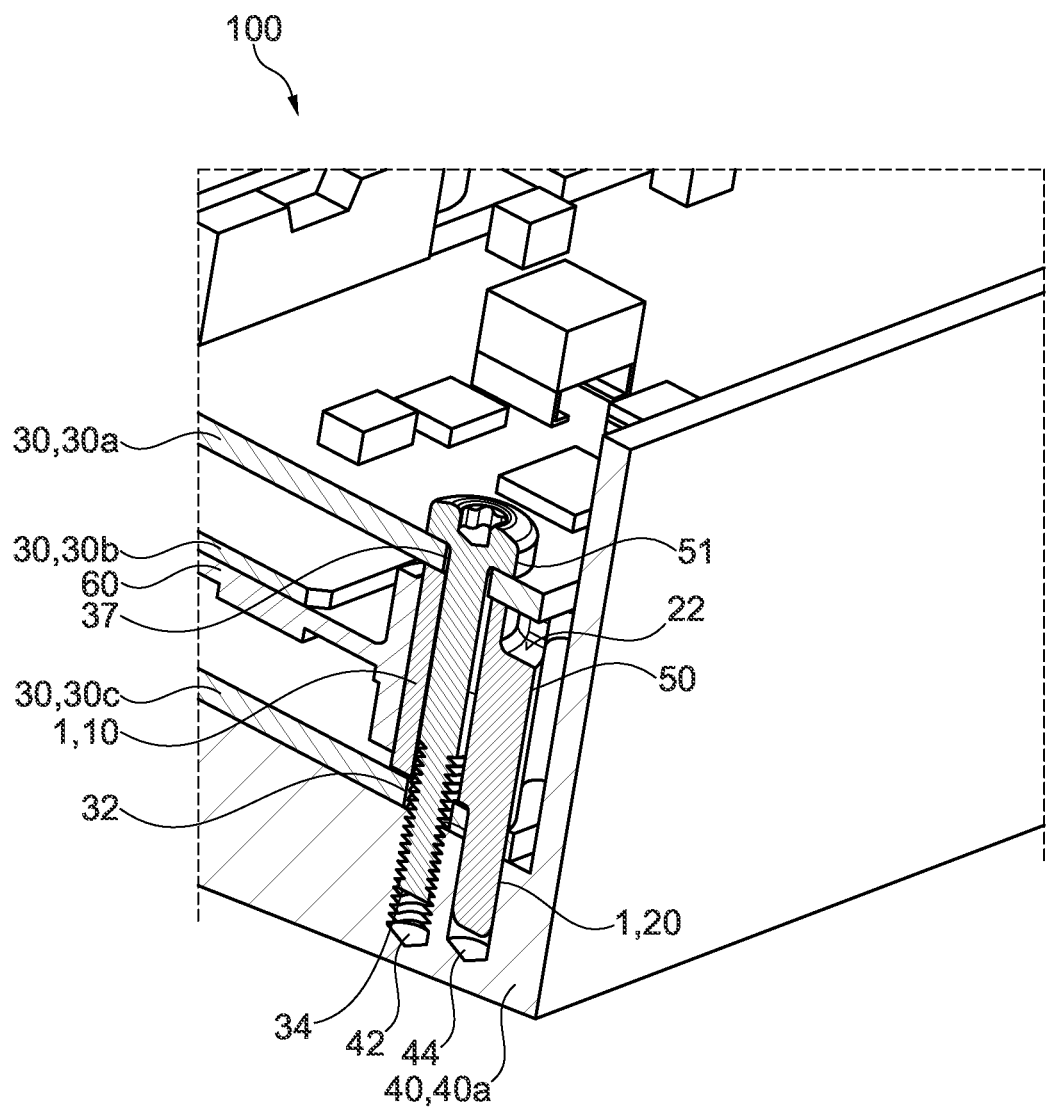

FIGS. 3a and 3b show an exemplary printed circuit board assembly 100 for power electronics. FIG. 3a shows the printed circuit board assembly 100 in a partially assembled yet still unfastened state with the press-in element 20 partially pressed in. FIG. 3b shows the printed circuit board assembly 100 in a fastened state with the press-in element 20 pressed in and with the first contact surface 12 and second contact surface 14 contacted on the relevant printed circuit boards 30a, 30c.

The illustrated and schematically simplified printed circuit board assembly 100 comprises a carrier element 40, which in the present example also serves as a housing 40a of the printed circuit board assembly 100. Further, the printed circuit board assembly 100 includes three printed circuit boards 30. The three printed circuit boards 30 include a first or upper printed circuit board 30, 30a, a second or lower printed circuit board 30, 30a, and an intermediate printed circuit board 30, 30b. The printed circuit boards 30, 30a, 30b, 30c each have an upper board surface 31 and a lower board surface 33. In the illustrated example, the printed circuit boards 30, 30a, 30b, 30c have a plurality of electronic and electrical components supported on the corresponding upper board surface 31. Also, although the components in FIGS. 3a and 3b are only apparent on the first printed circuit board 30, 30a, it should be understood that the intermediate printed circuit board 30, 30b and the second printed circuit board 30, 30c also include the same and/or different components. The printed circuit boards 30, 30a, 30b, 30c may also be referred to as printed circuit boards or PCBs. In principle, the term printed circuit board may refer to a first printed circuit board, a second printed circuit board, as well as one or more intermediate printed circuit boards.

The intermediate printed circuit board 30, 30b is arranged axially between the first printed circuit board 30, 30a and the second printed circuit board 30, 30c. More specifically, the intermediate printed circuit board 30, 30b is arranged on an upper surface 62 of an overmold element 60.

Figure 2A:
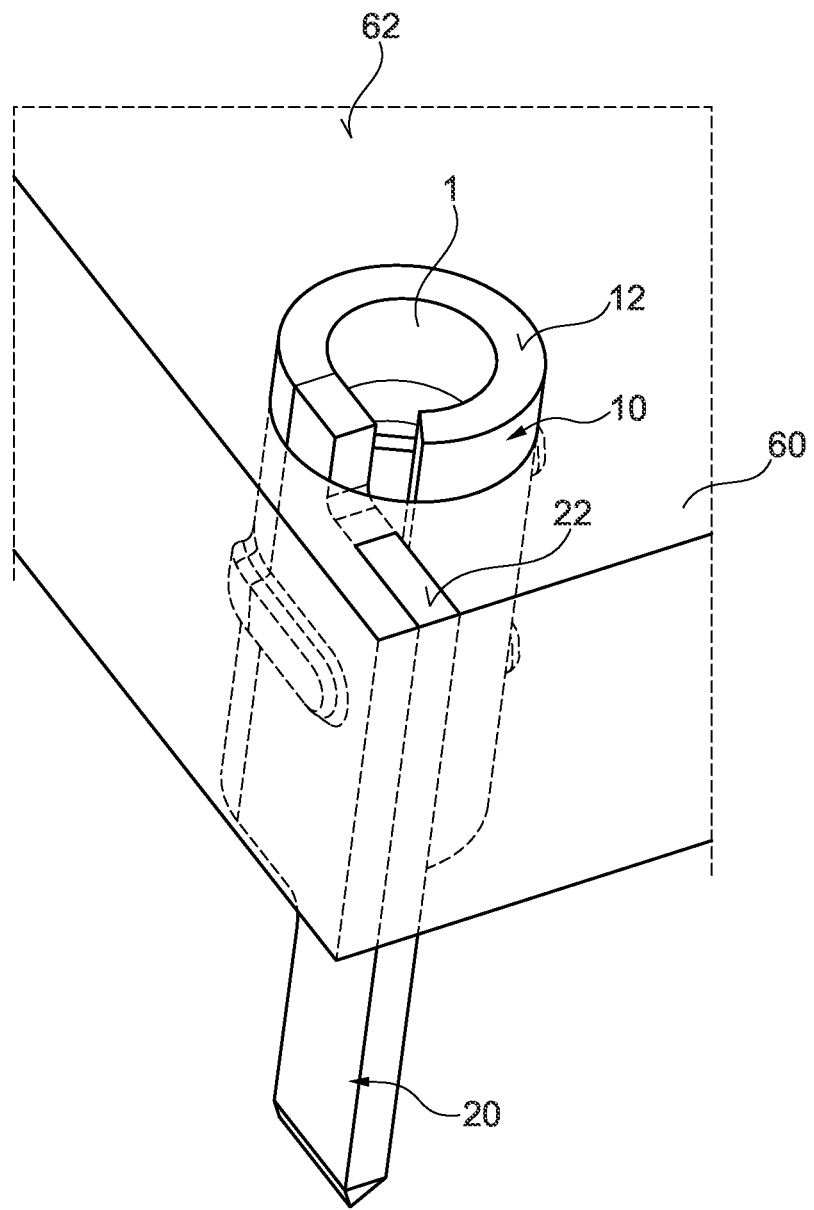
FIG. 2a shows the spacer element from FIG. 1a with a schematically indicated overmolded element.
Figure 2B:
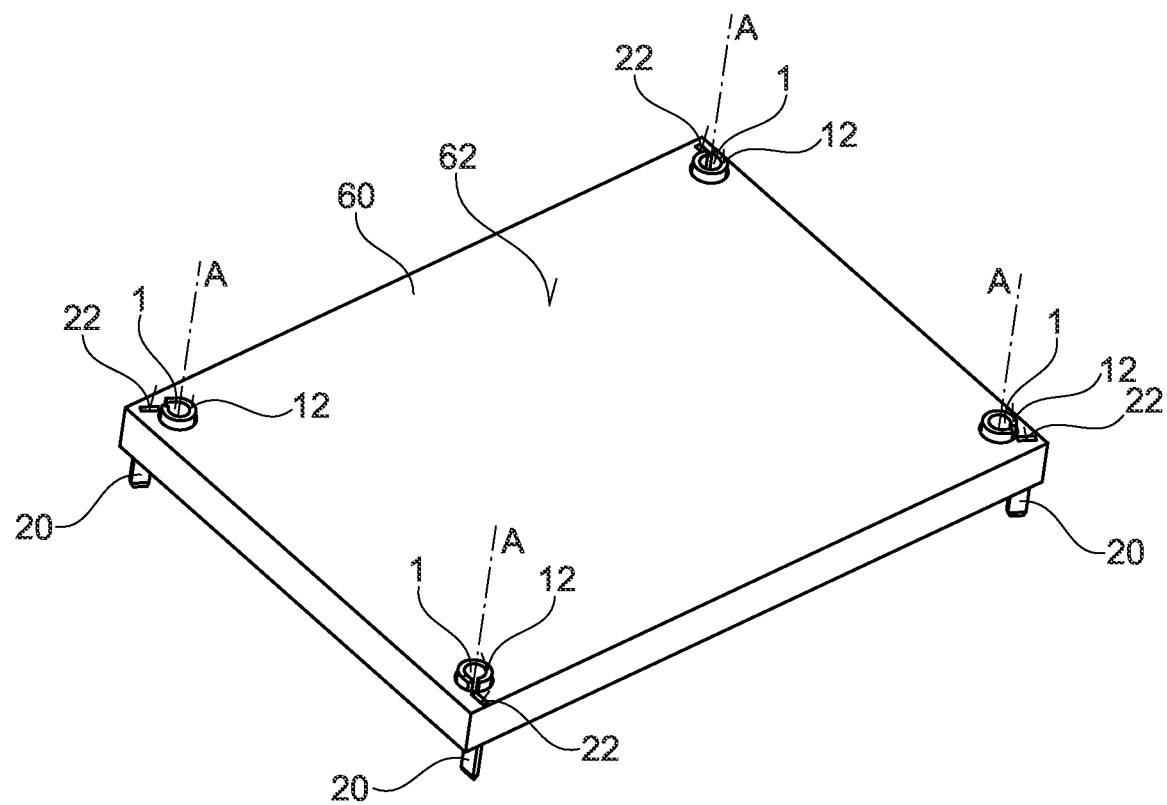
FIG. 2b shows an arrangement of four spacer elements with a common overmold element.

In other words, the printed circuit board assembly 100 comprises four spacer elements 1 and a plate-shaped overmold element 60 (see FIGS. 2a and 2b). The overmold element 60 is arranged between the first contact surface 12 and the second contact surface 14 on the spacer elements 1. Here, the first contact surface 12, the second contact surface 14 and the pressing surface 22 of the various spacer elements 1 are not covered by the overmold element 60. As shown in particular in FIG. 2a, the overmold element 60 can completely laterally surround the spacer element 1. In alternative embodiments, however, the overmold element 60 may only partially laterally encompass a respective spacer element 1. In particular, the overmold element 60 may be fastened to the main bodies 10 of the various spacer elements 1. In this case, the overmolded element 60 surrounds the stiffening elements 25 and is additionally supported by them (see FIG. 2a). In addition to improving the stability of the spacer element, the stiffening elements 25 also improve the retention of the overmolded element 60.

The overmold element 60 may comprise a plastics material. In particular, the overmold element 60 may be made of a plastics material. For example, the plastics material may comprise polybutylene terephthalate (PBT) or other suitable plastics familiar to those skilled in the art for such purposes. In addition, the plastics material may be applied by a plastics overmolding. The overmold element 60 may be understood as an element that is applied to the spacer element 1 or spacer elements 1 in an overmolding process, for example by a plastics injection molding. In alternative embodiments, a prefabricated element can also be used, which is fastened to one or more spacer elements 1 in a form-fitting or frictionally engaged manner, such as by a snap connection.

The overmold element 60, in particular its upper surface 62, extends parallel to printed circuit boards 30, 30a, 30b, 30c. As already mentioned, the overmold element 60 is plate-shaped and has a rectangular shape. Spacer elements 1 are arranged in corner regions. Thus, space for the intermediate printed circuit board 30, 30b can be provided in a major portion of the upper surface 62. The intermediate printed circuit board can thus be arranged on the upper surface 62 of the overmold element 60, as can be seen in FIGS. 3a and 3b. In particular, the intermediate printed circuit board 30, 30b is fixed on the upper surface 62 of the overmold element 60. The intermediate printed circuit board 30, 30b may have corresponding recesses in the region of a spacer element 1. In particular, the intermediate printed circuit board 30, 30b might not comprise fastening recesses 32 and/or press-in recess 34. The intermediate printed circuit board 30, 30b is electrically insulated from the spacer elements 1 by the overmolded element 60. Additional electrical lines may be provided to connect the intermediate printed circuit board to, for example, the first and/or the second printed circuit board 30, 30a, 30c and/or the housing 40, 40a.

The overmold element 60 may allow for simplified retention and orientation of the intermediate printed circuit board 30, 30b and spacer elements 1, particularly during assembly. The assembly of overmold element 60 and spacer elements 1 as shown in FIG. 2b can be prefabricated or preassembled with or without intermediate printed circuit board 30, 30b and then further assembled with the housing 40, 40, first and second printed circuit boards 30, 30a, 30c, and the fastening means 50. The overmolded element 60 results in considerable assembly simplifications, since the spacer elements 1 are already arranged at their predetermined positions for pressing-in in the housing 40, 40a and the contacting arrangement at the first and the second printed circuit board 30, 30a, 30c. Thus, for example, the second printed circuit board 30, 30c can be placed on a support surface 46 of the housing 40, 40a. Thereafter, the assembly formed of overmolded element 60 with the spacers 1 can be placed in the housing 40, 40a and pressed in via the contact surfaces 22 before the first printed circuit board 30, 30a is placed on and fastened in the housing 40, 40a via fastening means under controlled torque. In addition to simplifying assembly, the overmolded element 60 can improve rigidity and vibration resistance of the printed circuit board assembly 100, particularly in mobile applications. Although four spacer elements 1 and a single plate-shaped and rectangular overmold element 60 are shown in the figures, the printed circuit board assembly 100 could also include fewer or more than four spacer elements 1. In addition, the overmold element 60 could have a geometry other than rectangular and/or plate-shaped. For example, the overmold element 60 could also be polygonal or round in shape. The overmold element 60 could also be frame-shaped with one or more recesses, in particular in the axial direction 2. Also, instead of a single overmold element 60, one or more spacer elements 1 could comprise an overmold element 60 in each case or in subgroups together. One or more overmold elements 60 could be included in the printed circuit board assembly 100 even if no intermediate printed circuit board 30, 30*b* were to be provided. In embodiments, the one or more overmold elements 60 could also be configured to form at least one of, for example, two or more parallel surfaces for arranging intermediate printed circuit boards 30, 30*b*. This could be implemented, for example, by two or more plate-shaped planes in the overmold element 60 that are axially spaced apart. In further alternative embodiments, the one or more overmold elements 60 could be omitted entirely. Alternatively expressed, the printed circuit board assembly 60 could also comprise no overmold element 60. In such embodiments, if no alternative means for arranging an intermediate printed circuit board 30, 30*b* is provided, it is possible that the printed circuit board assembly 100 could not include any intermediate printed circuit boards 30, 30*b*.

Since the arrangement or fastening of the printed circuit board assembly 100 to the various spacer elements 1 is implemented analogously in each case, the further printed circuit board assembly will be further explained below with reference to a spacer element 1 with corresponding cooperating elements with reference to FIGS. 3*a* and 3*b*. It is understood here that the following explanations are applicable to printed circuit board assemblies 100 also with more or fewer than four spacer elements 1 and corresponding cooperating elements.

For each spacer element 1, the printed circuit board assembly 100 comprises a fastening means 50 in the form of a screw 50 having a screw head 51. For each spacer element 1, the carrier element 40 comprises a fastening indentation 42 and a press-in indentation 44 spaced therefrom. The first printed circuit board 30, 30*a* comprises a fastening recess 32 for each spacer element 1. The second printed circuit board 30, 30*c* comprises a fastening recess 32 and a press-in recess 34, spaced therefrom, for each spacer element 1.

The relative arrangement of the printed circuit boards 30, 30*a*, 30*b*, 30*c*, the housing 40, 40*a*, and of the spacer element 1 can be seen in particular from FIGS. 3*a* and 3*b*. The first printed circuit board 30, 30*a*, is arranged parallel to the second printed circuit board 30, 30*c*. The intermediate printed circuit board 30, 30*b* is also arranged parallel to the first printed circuit board 30, 30*a*, and to the second printed circuit board 30, 30*c*. The intermediate printed circuit board 30, 30*b* is arranged axially between the first printed circuit board 30, 30*a*, and the second printed circuit board 30, 30*a*. Likewise, the spacer element 1 is arranged axially between the first printed circuit board 30, 30*a*, and the second printed circuit board 30, 30*c*. The carrier element 40 comprises a support surface 46. The support surface 46 is arranged parallel to the first printed circuit board 30, 30*a*, and to the second printed circuit board 30, 30*c*. Here, the support surface 46 may be oriented in the same direction as the first contact surface 12 or as the upper board surface 31 of one of the printed circuit boards 30, 30*a*, 30*b*, 30*c*. The second printed circuit board 30, 30*c* is arranged on the support surface 46 in the housing 40, 40*a*. In particular, the second printed circuit board 30, 30*c* rests with its lower board surface 33 on the support surface 46 of the carrier element 40. That is to say, in particular, the lower board surface 33 of the second printed circuit board 30, 30*c* and the support surface 46 are arranged in parallel. Moreover, the second contact surface 14 and the second printed circuit board 30, 30*c* or its upper board surface 31 are parallel to each other. The first contact surface 12 is arranged parallel to the lower board surface 33 of the first printed circuit board 30, 30*a*. The second printed circuit board 30, 30*c* is arranged axially between, in particular directly between, the housing 40, 40*a* and the spacer element 1 or its main body 10. The spacer element 1 is arranged axially between, in particular directly between, the first printed circuit board 30, 30*a* and the second printed circuit board 30, 30*c*.

As can be seen in particular from FIG. 3*a*, the fastening recess 32 of the first printed circuit board 30, 30*a*, the passageway 16 of the spacer element 1, the fastening recess 32 of the second printed circuit board 30, 30*a*, and the fastening indentation 42 are aligned with each other. Thus, the screw 40 can be passed through the respective elements, wherein the screw head 51 rests on the upper board surface 31 of the first printed circuit board 30, 30*a*. The fastening means 50 or screw 50 is retained in the fastening indentation 42. The fastening indentation 42 is appropriately configured by a thread to allow the screw 50 to be frictionally fastened under precise torque control (see FIG. 3*b*). Alternatively expressed, the fastening indentation 42 may be a threaded bore into which the screw 50 is screwed. In this case, the first printed circuit board 30, 30*a*, the spacer element 1 and the second printed circuit board 30, 30*c* are braced or fastened between the housing 40, 40*a* and the screw head 51 under a controlled torque. In particular, the first printed circuit board 30, 30*a* is braced via the screw head 51 of the screw 50 in the direction of the carrier element 40 or housing 40*a*. Here, a counterforce for spacing can be applied by the spacer element 1 or its main body 10. In other words, the first printed circuit board 30, 30*a* may be clamped between the spacer element 1, in particular its first contact surface 12, and the screw head 51. Furthermore, the second printed circuit board 30, 30*c* may be clamped between the spacer element 1, in particular its second contact surface 14, and the housing 40, 40*a* or its supporting surface 46. By means of the spacer element 1 between the first printed circuit board 30, 30*a* and the second printed circuit board 30, 30*c*, these two printed circuit boards 30, 30*a*, 30*c* can be arranged at a distance from each other. In particular, the first contact surface 12 bears, with contact, against the lower board surface 33 of the first printed circuit board 30, 30*a*. The second contact surface 14 bears, with contact, against the upper board surface 31 of the second printed circuit board 30, 30*c*. In this example, therefore, the upper board surface 31 of the second printed circuit board 30, 30*c* corresponds to the spacing surface from which the first printed circuit board 30, 30*a* is spaced. Via the fastening means 50, reliable electrical contact can be made between the spacer element 1 and the first printed circuit board 30, 30*a*, and the second printed circuit board 30, 30*c*.

As can also be seen from FIGS. 3*a* and 3*b*, the press-in recess 34 of the second printed circuit board 30, 30*c* and the press-in indentation 44 of the housing 40, 40*a* are also aligned with each other. The press-in recess 34 extends axially from the upper board surface 31 of the second printed circuit board 30, 30*c* through the second printed circuit board 30, 30*c* to the lower board surface 33 of the second printed circuit board 30, 30*c*. Thus, the press-in element 20 can be passed through the press-in recess 34 and pressed into the press-in indentation 44. That is to say, the press-in element 20 extends through the press-in recess 34 and is pressed into the press-in indentation 44 of the carrier element 40. In this case, an extension of the press-in element 20 in the axial direction 2 from the second contact surface 14 to the first axial end 20*a* is less than an axial depth of the press-in indentation 44, in particular less than the sum of the axial depth of the press-in indentation 44 and the axial extension of the press-in recess 34. In advantageous embodiments, the press-in element 20 and the press-in indentation 44 are formed in such a way that, when the press-in element 20 is pressed in, cold welding takes place between the material of the press-in element 20 and the material surrounding the press-in indentation 44. Geometries and dimensions suitable for cold welding may include, for example, a round press-in indentation 44 and a cross-sectionally quadrangular press-in element 34, wherein a diagonal of the square press-in element 34 is greater than a diameter of the round press-in indentation 44 to achieve overlapping of the two materials and thereby cold welding. By cold welding, gas-tight electrical contacting between the spacer element 1 and the carrier element 40 or housing 40a can be achieved in a simple manner. Thus, an electrical ground connection for the first printed circuit board 30, 30a and the second printed circuit board 30, 30c can be provided via the spacer element 1. As a result, high-frequency currents from the first and second printed circuit boards 30, 30a, 30c can be conducted through the spacer element into the housing 40, 40a, and EMC grounding can be achieved from the first and second printed circuit boards 30, 30a, 30c.

Analogously to the press-in element 20 spaced from the passageway 16, the fastening indentation 42 and the press-in indentation 44 may be formed in the carrier element 40 spaced from each other. In particular, this may be implemented such that the two indentations 42, 44 do not coincide. In particular, the two indentations 42, 44 may be spaced apart by a wall portion of the carrier element 40. The wall portion may have a minimum wall thickness between 1.0 mm to 5.0 mm. In particular, the wall portion may have a minimum wall thickness of at least 1.5 mm, at least 2.0 mm, at least 3.0 mm, or at least 5.0 mm. In particular, the choice of the minimum wall thickness should be dependent on the thread diameter of the screw 50 or the thread of the fastening indentation 42. Furthermore, the geometries and dimensions of the indentations can be coordinated with the geometries and dimensions of the press-in element 20 and the passageway 16. The previous explanations also apply analogously to the fastening recess 32 and the press-in recess 34 of the second printed circuit board 30, 30c with the optional difference that these recesses 32, 34 do not have to be formed in a manner contacting the screw 50 or the press-in element 20 with respect to their diameter, but can be.

The fastening recess 32 of the first printed circuit board 30, 30a extends from the upper board surface 31 axially through the first printed circuit board 30, 30a to the lower board surface 33 of the first printed circuit board 30, 30a (see FIG. 3a). The fastening recess 32 of the second printed circuit board 30, 30c extends from the upper board surface 31 axially through the second printed circuit board 30, 30c to the lower board surface 33 of the second printed circuit board 30, 30c (see FIG. 3a). The first contact surface 12 of the spacer element 1 bears, with contact, against the lower board surface 33 of the first printed circuit board 30, 30a (see FIG. 3b). The second contact surface 14 of the spacer element 1 bears, with contact, against the upper board surface 31 of the second printed circuit board 30, 30c (see FIG. 3b).

The lower board surface 33 of the first printed circuit board 30, 30a may include a first contact surface portion 52, as schematically shown in FIG. 3a. The first contact surface portion 52 is arranged around the fastening recess 32 of the first printed circuit board 30, 30 and contacting the first contact surface 12. The first contact surface portion 52 may be annular. In particular, the first contact surface portion 52 may be formed as an annular portion with, for example, an interruption. In alternative embodiments, geometries other than annular formations of the first contact surface portion 52 are also possible. In particular, the first contact surface portion 52 may be formed to match the first contact surface 12, such that the first contact surface 12 is arranged within the first contact surface portion 52. In other words, the first contact surface 12 and/or the first contact surface portion 52 may be formed such that the first contact surface 12 is in contact only with the first contact surface portion 52 and with no other region of the lower board surface 33 of the first printed circuit board 30, 30a. The first contact surface portion 52 and the first contact surface 12 form a first pair of materials. In this regard, the contact surface portion 52 and the first contact surface 12 may be configured such that the first pair of materials form a maximum electrochemical voltage difference of 0.0 V to 1.0 V, particularly 0.1 V to 0.75 V, and preferably 0.2 V to 0.5 V with respect to their standard electrode potentials. In embodiments, the first pair of materials may have an electrochemical voltage difference of less than 1.0 V, in particular less than 0.75 V, preferably less than 0.5 V and particularly preferably less than 0.25 V. A lower electrochemical voltage difference of the first pair of materials can prevent or at least reduce or slow down corrosion at the first contact surface 12 and/or the first contact surface portion 52, which in turn can reliably maintain good electrical conductivity over a long service life. The first contact surface portion 52 may comprise at least one coating. The coating may comprise or be made of tin, palladium, rhodium, silver, gold, and/or nickel. Alternatively or additionally, the first contact surface portion 52 may comprise at least one contact pad. The contact pad may comprise or be made of tin, palladium, rhodium, silver, gold, and/or nickel. In particular, the coating and/or contact pad may comprise or be made of alloys comprising such materials. In particular, multiple different coatings or material layers are possible to reduce electrochemical voltage differences between adjacent pairs of materials. In particular, when silver or gold are used as contact materials, they may be provided with a nickel sub-layer. Having a nickel sub-layer can be understood as comprising a nickel barrier layer. This can prevent or at least reduce corrosion through pores in the plating. Here, the directly contacting surfaces of the first contact surface portion 52 and the first contact surface 12 form the first pair of materials.

The upper board surface 31 of the second printed circuit board 30, 30c may include a second contact surface portion 54, as schematically shown in FIG. 3a. The second contact surface portion 54 may be arranged around the fastening recess 32 of the second printed circuit board 30, 30c and contacting the second contact surface 14. The second contact surface portion 54 may be annular. In particular, the second contact surface portion 54 may be formed as an annular portion with, for example, an interruption. In embodiments, geometries other than annular formations of the second contact surface portion 54 are also possible. In particular, the second contact surface portion 54 may be formed to match the second contact surface 14, such that the second contact surface 14 is arranged within the second contact surface portion 54. In other words, the second contact surface 12 and/or the second contact surface portion 54 may be formed such that the second contact surface 14 is in contact only with the second contact surface portion 54 and with no other region of the upper board surface 31 of the second printed circuit board 30, 30c. The second contact surface portion 54 and the second contact surface 14 form a second pair of materials. In this regard, the second contact surface portion 54 and the second contact surface 14 may be configured such that the second pair of materials form a maximum electrochemical voltage difference of 0.0 V to 1.0 V, particularly 0.1 V to 0.75 V, and preferably 0.2 V to 0.5 V with respect to their standard electrode potentials. In embodiments, the second pair of materials may have an electrochemical voltage difference of less than 1.0 V, in particular less than 0.75 V, preferably less than 0.5 V and particularly preferably less than 0.25 V. Due to a lower electrochemical voltage difference of the second pair of materials, corrosion of the second contact surface 12 and/or of the second contact surface portion 54 can be avoided or at least reduced or slowed down, which in turn allows good electrical conductivity to be reliably maintained over a long service life. The second contact surface portion 54 may comprise at least one coating. The coating may comprise or be made of tin, palladium, rhodium, silver, gold, and/or nickel. Alternatively or additionally, the second contact surface portion 54 may comprise at least one contact pad. The contact pad may comprise or be made of tin, palladium, rhodium, silver, gold, and/or nickel. In particular, the coating and/or contact pad may comprise or be made of alloys comprising such materials. In particular, multiple different coatings or layers of materials are possible to reduce electrochemical voltage differences between adjacent pairs of materials. In particular, when silver or gold are used as contact materials, they may be provided with a nickel sub-layer. Having a nickel sub-layer can be understood as comprising a nickel barrier layer. This can prevent or at least reduce corrosion through pores in the plating. The directly contacting surfaces of the second contact surface portion 54 and the second contact surface 14 form the second pair of materials.

The carrier element 40 and the housing 40a are made of an aluminum alloy. In alternative embodiments, the carrier element 40 or the housing 40a may comprise aluminum or an aluminum alloy or another metal or non-metal material. The support surface 46 on which the second printed circuit board 30, 30c rests comprises an electrical insulating layer. The electrical insulating layer may comprise an oxide material. In particular, the support surface 46 may be coated with an oxide layer to form the electrical insulating layer. The oxide material or layer may provide electrical insulation. The electrical insulating layer may allow the second printed circuit board 30, 30c to rest on the support surface 46 directly and be cooled areally by the carrier element 40 or the housing 40a. Alternatively, or in addition to the electrical insulating layer on the support surface, the lower board surface 33 of the second printed circuit board 30, 30c may comprise an electrical insulating layer such as an oxide material and/or an oxide layer. By means of this, the second printed circuit board 30, 30c can be arranged on the carrier element 40 or housing 40a in an electrically insulated manner. Due to the fact that the second printed circuit board 30, 30c rests on the support surface 46, a better heat dissipation or cooling effect for the second printed circuit board 30, 30c can be achieved.

As mentioned above, in the exemplary embodiments shown, the carrier element 40 is formed as a housing 40a of the printed circuit board assembly 100. Alternatively, the printed circuit board assembly 100 may additionally comprise a housing 40a in which the carrier element 40 and the further elements of the printed circuit board assembly 100 are arranged.

Although the printed circuit board assembly 100 shown in the detailed description includes three printed circuit boards 30 having a first printed circuit board 30, 30a, a second printed circuit board 30, 30c, and an intermediate printed circuit board 30, 30b, the present disclosure also covers printed circuit board assemblies 100 having fewer or more than three printed circuit boards 30. For example, the printed circuit board assembly 100 could include no intermediate printed circuit board 30, 30b. In further examples, the printed circuit board assembly 100 could include only a first printed circuit board 30, 30a and no, one, or more intermediate printed circuit boards 30, 30b, and no second printed circuit board 30, 30c resting on the support surface 46 as defined in the present disclosure. In such examples, the second contact surface 14 could bear, with contact, against the support surface 46 or its electrically insulating layer, if present. Alternatively formulated, in such examples without the second printed circuit board 30, 30c, the support surface 46 may correspond to the spacing surface.

The present disclosure further relates to power electronics. The power electronics may include one or more printed circuit board assemblies 100 as previously described.

Although the present invention has been described above and is defined in the appended claims, it should be understood that the invention may alternatively be defined also according to the following embodiments:

1. A spacer element (1) for spacing at least one printed circuit board (30) from an opposite spacing surface, comprising:
    a main body (10) having a first contact surface (12) for bearing against the at least one printed circuit board (30) and a second contact surface (14) for bearing against the spacing surface,
        wherein the main body (10) has a spacing length (L) between the first contact surface (12) and the second contact surface (14) along a main body axis (A),
        wherein a passageway (16) extends through the main body (10) along the main body axis (A) from the first contact surface (12) to the second contact surface (14), and
    a press-in element (20) arranged laterally to the main body axis (A) on the main body (10) and extending beyond the second contact surface (14), and
        wherein the spacer element (1) comprises an electrically conductive material for electrically conducting from at least the first contact surface (12) to the press-in element (20).
2. The spacer element (1) as claimed in embodiment 1, wherein the press-in element (20) extends parallel to the main body axis (A) beyond the second contact surface (14).
3. The spacer element (1) as claimed in any of the preceding embodiments, wherein the press-in element (20) has a quadrangular cross-section.
4. The spacer element (1) as claimed in any of the preceding embodiments, wherein the main body (10) and the press-in element (20) are integrally formed together.
5. The spacer element (1) as claimed in any of the preceding embodiments, wherein the spacer element (1) comprises copper.
6. The spacer element (1) as claimed in embodiment 5, wherein the spacer element (1) is made of copper, in particular a copper alloy.
7. The spacer element (1) as claimed in any of the preceding embodiments, wherein the spacer element (1) is produced in a stamping and bending process.
8. The spacer element (1) as claimed in any of the preceding embodiments, further comprising at least one stiffening element (25) arranged on an outer surface (13) of the spacer element (1).
9. The spacer element (1) as claimed in embodiment 8, wherein the at least one stiffening element (25) comprises an elevation projecting outwardly from the outer surface (13).
10. The spacer element (1) as claimed in any of embodiments 8 or 9, wherein the at least one stiffening element (25) comprises an indentation that is recessed into the outer surface (13).
11. The spacer element (1) as claimed in any of embodiments 8 to 10, wherein the at least one stiffening element (25) is embossed into the spacer element (1).
12. The spacer element (1) as claimed in any of embodiments 8 to 11, wherein the at least one stiffening element (25) is rib-like.
13. The spacer element (1) as claimed in any of embodiments 8 to 12, wherein the at least one stiffening element (25) extends at least partially in a direction along the main body axis (A) and/or at least partially in a direction transverse, in particular circumferential, to the main body axis (A) on the spacer element (1).
14. The spacer element (1) as claimed in any of the preceding embodiments, wherein the first contact surface (12) is arranged parallel and opposite to the second contact surface (14), along the main body axis (A).
15. The spacer element (1) as claimed in any of the preceding embodiments, wherein the first contact surface (12) and/or the second contact surface (14) comprises at least one contact material having a higher standard electrode potential than the main body (10) and/or the press-in element (20).
16. The spacer element (1) as claimed in embodiment 15, wherein the at least one contact material is applied by a coating or is applied in the form of one or more contact pads on the first contact surface (12) and/or the second contact surface (14).
17. The spacer element (1) as claimed in any of embodiments 15 or 16, wherein the at least one contact material comprises tin, palladium, rhodium, silver, gold and/or nickel.
18. The spacer element (1) as claimed in any of the preceding embodiments, wherein the first contact surface (12) and/or the second contact surface (14) are annular.
19. The spacer element (1) as claimed in any of the preceding embodiments, wherein a press-in pin is formed on the first contact surface (12) and/or on the second contact surface (14), which pin protrudes from the relevant contact surface (12, 14).
20. The spacer element (1) as claimed in any of the preceding embodiments, wherein the press-in element (20) extends beyond the second contact surface (14) and forms a first axial end (20a).
21. The spacer element (1) as claimed in embodiment 20, further comprising a pressing surface (22) formed opposite the first axial end (20a) on the press-in element (20).
22. The spacer element (1) as claimed in embodiment 21, wherein the pressing surface (22) is spaced from the first contact surface (12) in a lateral direction (4, 6) and/or in the axial direction (2).
23. A printed circuit board assembly (100) for power electronics comprising:
a carrier element (40) with at least one fastening indentation (42) and a press-in indentation (44),
at least one printed circuit board (30) having at least one fastening recess (32),
at least one spacer element (1) as claimed in any of the preceding embodiments, which is arranged between the printed circuit board (30) and the carrier element (40), and
at least one fastening means (50) via which the at least one printed circuit board (30) is fastened to the carrier element (40).
24. The printed circuit board assembly (100) as claimed in embodiment 23, wherein the fastening means (50) is retained in the fastening indentation (42).
25. The printed circuit board assembly (100) as claimed in any of embodiments 23 or 24, wherein the press-in element (20) is pressed into the press-in indentation (44).
26. The printed circuit board assembly (100) as claimed in any of embodiments 23 to 25, wherein the fastening means (50) is a screw, wherein the fastening indentation (42) is a threaded bore into which the screw is screwed, and wherein the at least one printed circuit board (30) is braced in the direction of the carrier element (40) via a screw head (51) of the screw.
27. The printed circuit board assembly (100) as claimed in any of embodiments 23 to 26, wherein the press-in element (20) and the press-in indentation (44) are formed such that cold welding occurs when the press-in element (20) is pressed in.
28. The printed circuit board assembly (100) as claimed in any of embodiments 23 to 27, wherein the fastening indentation (42) and the press-in indentation (44) are formed in the carrier element (40) spaced apart from each other.
29. The printed circuit board assembly (100) as claimed in any of embodiments 23 to 28, wherein the carrier element (40) is a housing (40a) of the printed circuit board assembly (100).
30. The printed circuit board assembly (100) as claimed in any of embodiments 23 to 28, further comprising a housing (40a) in which the carrier element (40), the at least one printed circuit board (30), the at least one spacer element (1), and the at least one fastening means (50) are arranged.
31. The printed circuit board assembly (100) as claimed in any of embodiments 23 to 30, wherein the carrier element (40) comprises, in particular is made of, aluminum or an aluminum alloy.
32. The printed circuit board assembly (100) as claimed in any of embodiments 23 to 31, wherein the carrier element (40) comprises a support surface (46) oriented parallel to the at least one printed circuit board (30).
33. The printed circuit board assembly (100) as claimed in embodiment 32, wherein the support surface (46) is oriented in the same direction as the first contact surface (12).
34. The printed circuit board assembly (100) as claimed in any of embodiments 32 or 33, wherein the support surface (46) comprises an oxide material, in particular, wherein the support surface (46) is coated with an oxide layer.
35. The printed circuit board assembly (100) as claimed in any of embodiments 23 to 34, wherein the at least one printed circuit board (30) has an upper board surface (31) and a lower board surface (33), wherein the at least one fastening recess (32) extends from the upper board surface (31) through the printed circuit board (30) to the lower board surface (33).

36. The printed circuit board assembly (100) as claimed in embodiment 35, wherein the at least one printed circuit board (30) comprises a first printed circuit board (30a), and wherein the first contact surface (12) bears, with contact, against the lower board surface (33) of the first printed circuit board (30a).
37. The printed circuit board assembly (100) as claimed in embodiment 36, wherein the lower board surface (33) of the first printed circuit board (30a) comprises a first contact surface portion (52) arranged around the at least one fastening recess (32) and contacting the first contact surface (12).
38. The printed circuit board assembly (100) as claimed in embodiment 37, wherein the first contact surface portion (52) and the first contact surface (12) are configured in such a way that they form a first pair of materials having a maximum electrochemical voltage difference of from 0.0 V to 1.0 V, particularly from 0.1 V to 0.75 V, and preferably from 0.2 V to 0.5 V with respect to their standard electrode potentials.
39. The printed circuit board assembly (100) as claimed in any of embodiments 37 or 38, wherein the first contact surface portion (52) comprises at least one coating or at least one contact pad comprising or made of tin, palladium, rhodium, silver, gold, and/or nickel.
40. The printed circuit board assembly (100) as claimed in any of the preceding embodiments, if at least dependent on embodiment 26 and embodiment 36, wherein the screw head (51) bears against the upper board surface (31) of the first printed circuit board (30a) and braces it in the direction of the carrier element (40).
41. The printed circuit board assembly (100) as claimed in any of embodiments 32 to 40, wherein the second contact surface (14) bears, with contact, against the support surface (46) of the carrier element (40).
42. The printed circuit board assembly (100) as claimed in any of embodiments 36 to 41, wherein the at least one printed circuit board (30) comprises a second printed circuit board (30c) arranged parallel to the first printed circuit board (30a), and wherein the second contact surface (14) bears, with contact, against the upper board surface (31) of the second printed circuit board (30c).
43. The printed circuit board assembly (100) as claimed in embodiment 42, wherein the second printed circuit board (30c) is arranged between the carrier element (40) and the second contact surface (14).
44. The printed circuit board assembly (100) as claimed in embodiment 43, if at least dependent on embodiment 32, wherein the second printed circuit board (30c) rests with its lower board surface (33) on the support surface (46) of the carrier element (40).
45. The printed circuit board assembly (100) as claimed in any of embodiments 42 to 44, wherein the upper board surface (31) of the second printed circuit board (30c) comprises a second contact surface portion (54) arranged around the at least one fastening recess (32) and contacting the second contact surface (14).
46. The printed circuit board assembly (100) as claimed in embodiment 45, wherein the second contact surface portion (54) and the second contact surface (14) are configured in such a way that they form a second pair of materials having a maximum electrochemical voltage difference of from 0.0 V to 1.0 V, particularly from 0.1 V to 0.75 V, and preferably from 0.2 V to 0.5 V with respect to their standard electrode potentials.
47. The printed circuit board assembly (100) as claimed in either of embodiments 45 or 46, wherein the second contact surface portion (54) comprises a coating or a contact pad comprising or made of tin, palladium, rhodium, silver, gold, and/or nickel.
48. The printed circuit board assembly (100) as claimed in any of embodiments 42 to 47, wherein the second printed circuit board (30c) includes at least one press-in recess (34) spaced from the at least one fastening recess (32) and aligned with the at least one press-in indentation (44) of the carrier element (40).
49. The printed circuit board assembly (100) as claimed in embodiment 48, wherein the at least one press-in recess (34) extends from the upper board surface (31) through the second printed circuit board (30c) to the lower board surface (33), and wherein the press-in element (20) protrudes through the press-in recess (34) and is pressed into the press-in indentation (44) of the carrier element (40).
50. The printed circuit board assembly (100) as claimed in any of embodiments 23 to 49, wherein the printed circuit board assembly (100) comprises at least two spacer elements (1) and at least two fastening means (50), wherein the carrier element (40) has at least two fastening indentations (42) and two press-in indentations (44), wherein the at least one printed circuit board (30) has at least two fastening recesses (32) in each case, and wherein the at least one printed circuit board (30) is fastened to the carrier element (40) via the at least two fastening means (50), each of which extends through a fastening recess (32), through a passageway (16), and into its own fastening indentation (42).
51. The printed circuit board assembly (100) as claimed in embodiment 50, further comprising a plate-shaped overmold element (60) fastened to the main bodies (10) of the at least two spacer elements (1) and extending parallel to the at least one printed circuit board (30).
52. The printed circuit board assembly (100) as claimed in embodiment 51, wherein the overmold element (60) comprises a plastics material.
53. The printed circuit board assembly (100) as claimed in any of embodiments 51 or 52, further comprising an intermediate printed circuit board (30b) arranged on, in particular fastened to, an upper surface (62) of the overmold element (60).
54. The printed circuit board assembly (100) as claimed in embodiment 53, wherein the intermediate printed circuit board (30b) is arranged parallel to the at least one printed circuit board (30).
55. Power electronics comprising a printed circuit board assembly (100) as claimed in any of the preceding embodiments 23 to 54.

LIST OF REFERENCE SIGNS

A main body axis
L spacing length
1 spacer element
2 axial direction
4 radial direction
6 circumferential direction
10 main body
12 first contact surface
13 outer surface
14 second contact surface
16 passageway
20 press-in element 20a first axial end
22 contact surface
25 stiffening element
30 printed circuit board
30a first printed circuit board
30b intermediate printed circuit board
30c second printed circuit board
31 upper board surface
32 fastening recess
33 lower board surface
34 press-in recess
40 carrier element
40a housing
42 fastening indentation
44 press-in indentation
46 support surface
50 fastening means/screw
51 screw head
52 first contact surface portion
54 second contact surface portion
60 overmold element
62 upper surface
100 printed circuit board assembly

The invention claimed is:

1. A spacer element (1) for spacing at least one printed circuit board (30) from an opposite spacing surface, comprising:
a main body (10) having a first contact surface (12) for bearing against the at least one printed circuit board (30) and a second contact surface (14) for bearing against the spacing surface, wherein the main body (10) has a spacing length (L) between the first contact surface (12) and the second contact surface (14) along a main body axis (A), and wherein a passageway (16) extends through the main body (10) along the main body axis (A) from the first contact surface (12) to the second contact surface (14), and
a press-in element (20) arranged laterally to the main body axis (A) on the main body (10) and extending beyond the second contact surface (14),
wherein the spacer element (1) comprises an electrically conductive material for electrically conducting from at least the first contact surface (12) to the press-in element (20).

2. The spacer element (1) as claimed in claim 1, wherein the spacer element (1) comprises copper.

3. The spacer element (1) as claimed in claim 1, wherein the spacer element (1) is produced in a stamping and bending process.

4. The spacer element (1) as claimed in claim 1, further comprising at least one stiffening element (25) arranged on an outer surface (13) of the spacer element (1).

5. The spacer element (1) as claimed in claim 1, wherein at least one of the first contact surface (12) and the second contact surface (14) comprises at least one contact material having a higher standard electrode potential than at least one of the main body (10) and the press-in element (20).

6. The spacer element (1) as claimed in claim 1, wherein the press-in element (20) extends beyond the second contact surface (14) and forms a first axial end (20a), and further comprising a pressing surface (22) formed opposite the first axial end (20a) on the press-in element (20).

7. A printed circuit board assembly (100) for power electronics comprising:
a carrier element (40) with at least one fastening indentation (42) and a press-in indentation (44),
at least one printed circuit board (30) having at least one fastening recess (32),
at least one spacer element (1), which is arranged between the printed circuit board (30) and the carrier element (40), for spacing at least one printed circuit board (30) from an opposite spacing surface, comprising:
a main body (10) having a first contact surface (12) for bearing against the at least one printed circuit board (30) and a second contact surface (14) for bearing against the spacing surface, wherein the main body (10) has a spacing length (L) between the first contact surface (12) and the second contact surface (14) along a main body axis (A), and wherein a passageway (16) extends through the main body (10) along the main body axis (A) from the first contact surface (12) to the second contact surface (14), and
a press-in element (20) arranged laterally to the main body axis (A) on the main body (10) and extending beyond the second contact surface (14),
wherein the spacer element (1) comprises an electrically conductive material for electrically conducting from at least the first contact surface (12) to the press-in element (20), and
at least one fastening means (50) via which the at least one printed circuit board (30) is fastened to the carrier element (40).

8. The printed circuit board assembly (100) as claimed in claim 7, wherein the press-in element (20) is pressed into the press-in indentation (44).

9. The printed circuit board assembly (100) as claimed in claim 7, wherein the fastening means (50) is a screw, wherein the fastening indentation (42) is a threaded bore into which the screw is screwed, and wherein the at least one printed circuit board (30) is braced in the direction of the carrier element (40) via a screw head (51) of the screw.

10. The printed circuit board assembly (100) as claimed in claim 7, wherein the press-in element (20) and the press-in indentation (44) are formed such that cold welding occurs when the press-in element (20) is pressed in.

11. The printed circuit board assembly (100) as claimed in claim 9, wherein the at least one printed circuit board (30) has an upper board surface (31) and a lower board surface (33), wherein the at least one fastening recess (32) extends from the upper board surface (31) through the printed circuit board (30) to the lower board surface (33).

12. The printed circuit board assembly (100) as claimed in claim 11, wherein the at least one printed circuit board (30) comprises a first printed circuit board (30a), and wherein the first contact surface (12) bears, with contact, against the lower board surface (33) of the first printed circuit board (30a).

13. The printed circuit board assembly (100) as claimed in claim 12, wherein the screw head (51) bears against the upper board surface (31) of the first printed circuit board (30a) and braces it in the direction of the carrier element (40).

14. The printed circuit board assembly (100) as claimed in claim 12, wherein the at least one printed circuit board (30) comprises a second printed circuit board (30c) arranged parallel to the first printed circuit board (30a), and wherein the second contact surface (14) bears, with contact, against the upper board surface (31) of the second printed circuit board (30c).

15. A printed circuit board assembly (100) for power electronics comprising:
a carrier element (40) with at least one fastening indentation (42) and a press-in indentation (44), at least one printed circuit board (30) having at least one fastening recess (32), at least one spacer element (1), which is arranged between the printed circuit board (30) and the carrier element (40), for spacing at least one printed circuit board (30) from an opposite spacing surface, comprising:

a main body (10) having a first contact surface (12) for bearing against the at least one printed circuit board (30) and a second contact surface (14) for bearing against the spacing surface, wherein the main body (10) has a spacing length (L) between the first contact surface (12) and the second contact surface (14) along a main body axis (A), and wherein a passageway (16) extends through the main body (10) along the main body axis (A) from the first contact surface (12) to the second contact surface (14), and a press-in element (20) arranged laterally to the main body axis (A) on the main body (10) and extending beyond the second contact surface (14), wherein the spacer element (1) comprises an electrically conductive material for electrically conducting from at least the first contact surface (12) to the press-in element (20), and at least one fastening means (50) via which the at least one printed circuit board (30) is fastened to the carrier element (40), wherein the fastening means (50) is a screw, wherein the fastening indentation (42) is a threaded bore into which the screw is screwed, and wherein the at least one printed circuit board (30) is braced in the direction of the carrier element (40) via a screw head (51) of the screw, wherein the at least one printed circuit board (30) comprises a first printed circuit board (30a), and wherein the first contact surface (12) bears, with contact, against the lower board surface (33) of the first printed circuit board (30a), and wherein the lower board surface (33) of the first printed circuit board (30a) comprises a first contact surface portion (52) arranged around the at least one fastening recess (32) and contacting the first contact surface (12), and wherein the first contact surface portion (52) and the first contact surface (12) are configured in such a way that they form a first pair of materials having a maximum electrochemical voltage difference of from 0.0 V to 1.0 V with respect to their standard electrode potentials.

* * * * *